United States Patent
Okuda et al.

Patent Number: 5,874,174
Date of Patent: Feb. 23, 1999

[54] CONDUCTOR FILM AND ITS FORMING METHOD

[75] Inventors: Akira Okuda, Sakai; Hatsuhiko Shibasaki, Ibaraki; Kenji Maruyama, Neyagawa; Takashi Tanino, Nara-ken; Yasuhiro Kobayashi, Higashi-osaka, all of Japan

[73] Assignee: Matsushita Electric Industrial Co., Ltd., Japan

[21] Appl. No.: 693,369

[22] Filed: Aug. 6, 1996

[30] Foreign Application Priority Data

Aug. 9, 1995 [JP] Japan .................................. 7-203129

[51] Int. Cl.⁶ ...................................................... B32B 17/06
[52] U.S. Cl. ......................... 428/426; 428/432; 428/651; 428/699; 156/101; 156/275.5
[58] Field of Search .......................... 156/99, 101, 275.5; 428/688, 689, 411.1, 415, 426, 432, 325, 632, 651, 666, 671, 699

[56] References Cited

U.S. PATENT DOCUMENTS

| | | | |
|---|---|---|---|
| 5,578,657 | 11/1996 | Inoue et al. | 522/92 |
| 5,616,423 | 4/1997 | Saniyou et al. | 428/632 |
| 5,653,837 | 8/1997 | Tabuki et al. | 156/99 |

OTHER PUBLICATIONS

"Sputtering Phenomenon" by Akira Kanehara, published by Tokyo University Shuppankai.
"Thin Film Technology" Shigeru Hayakawa et al., published by Kyoritsu Shuppan K.K.

*Primary Examiner*—Elizabeth Evans
*Attorney, Agent, or Firm*—Parkhurst & Wendel

[57] ABSTRACT

When forming a conductor film of Ag, Au, Cu, Al on a substrate of ceramics or glass, an adhesive layer of Cr, NiCr is formed on the substrate, a mixed layer of adhesive layer material and conductor film material is formed on the adhesive layer, and a conductor film is formed on the mixed layer. According to this method, even if film forming is conducted below the temperature for inducing diffusion on the interface of the conductor film and adhesive layer, for example, below 100° C., an alloy layer of adhesive layer material and conductor film material is present on the interface of the adhesive layer and conductor film to be closer to bulk state, and the attraction between molecules is increased, so that the bonding strength of the conductor film and adhesive layer is enhanced. Therefore, at 100° C. or more, a conductor film which hardly causes peeling may be formed on the substrate to be used in electronic components which vary in electric characteristics or on the film form substrate which deforms thermally.

6 Claims, 3 Drawing Sheets

CONDUCTOR FILM AND ITS FORMING METHOD

FIELD OF THE INVENTION

The present invention relates to a conductor film such as electrode film and wiring film formed on a substrate, and its forming method.

BACKGROUND OF THE INVENTION

Recently, in manufacture of electronic components and thin film devices, sputter films and evaporation films of Ag, Au, Cu, Al, and others are generally used as conductor films such as electrode films and wiring films. In the case of the substrate being made of ceramics or glass, a desired bonding strength is not obtained by a single material, and a layer of Cr, NiCr, having a strong adhesion strength with ceramics and glass is formed as an adhesive layer, and a multi-layer structure is composed.

For example, in a method of forming a conductor film by sputtering, a cathode having a material target of conductor film and a cathode having a material target of adhesive layer are disposed inside a vacuum container, confronting a substrate, and the inside of the vacuum container is evacuated to a degree of vacuum of about $10^{-6}$ Torr level, and then argon gas is introduced into the vacuum container to set the degree of vacuum at about $5 \times 10^{-3}$ Torr.

Afterwards, by applying a direct-current voltage or high-frequency voltage to the cathode having material target of adhesive layer, plasma is generated inside the vacuum container, and an adhesive layer is formed on the substrate. Then, after stopping the application of voltage to the cathode having material target of adhesive layer, a direct-current voltage or high-frequency voltage is applied to the cathode having material target of conductor film, and plasma is generated inside the vacuum container, thereby forming a conductor film such as electrode film and wiring film on the adhesive layer formed beforehand.

When forming the adhesive layer in this manner, usually, by forming a film by heating the substrate over 100° C. or annealing after forming a film, diffusion is induced in the interface of the conductor film and adhesive layer, and the bonding strength is improved on the interface of the conductor film and adhesive layer, so that peeling is prevented.

Some of ceramic substrates used in electronic components, cannot be heated over 100° C. because, polarization occurs and piezo electric cannot be heated over 100° C. because when the substrate temperature becomes high. Or, if the substrate is formed into a film or if the substrate is fixed on a film, it is not allowed to heat over the thermal deformation temperature of the film. In such cases, the bonding strength of the conductor film and adhesive layer cannot be improved by the above method, and peeling may occurs in the interface of the conductor film and adhesive layer in a later machining process, and the product life may be shortened or defects may occur.

DISCLOSURE OF THE INVENTION

The invention is intended to solve the above problems, and it is hence an object thereof to heighten the bonding force between the conductor film and adhesive layer without heating the substrate over the temperature to induce diffusion on the interface of the conductor film and adhesive layer.

To achieve the object, the conductor film of the invention, which is formed on a substrate of ceramics, glass, comprises an adhesive layer on a substrate, and a mixed layer of adhesive layer material and conductor film material on the interface of the adhesive layer and conductor film.

Preferably, the conductor film contains at least Ag, Au, Cu or Al.

Also preferably, the adhesive layer contains at least Cr or NiCr.

A forming method of conductor film of the invention for forming a conductor film of Ag, Au, Cu, Al, etc. on a substrate of ceramics, glass, comprises the steps of forming an adhesive layer of Cr, NiCr, on a substrate by sputtering or evaporation, forming a mixed layer of adhesive layer material and conductor film material on the adhesive layer, and forming a conductor film on the mixed layer.

This forming method of conductor film can be done at film forming temperature of 100° C. or less.

More specifically, a cathode having conductor film material and a cathode having adhesive layer material are installed in a same vacuum container of a sputtering apparatus, in the sputtering process, initially only the cathode having adhesive layer material is discharged for time T1 to form an adhesive layer on the substrate, then the cathode having adhesive layer material and the cathode having conductor film material are simultaneously discharged for time T2 to form a mixed layer of adhesive layer material and conductor film material, and only the cathode having conductor film material is discharged for time T3 to form a conductor film.

Alternatively, a first cathode having adhesive layer material and a second cathode having conductor film material are installed in a same vacuum container of a sputtering apparatus with a shield plate standing therebetween, a film form substrate such as a film composed of substrate material or a film bearing a substrate thereon is sputtered while moving the position confronting each cathode and shield plate in a direction from the first cathode to the second cathode at a constant speed to form an adhesive layer in a region confronting the first cathode, a mixed layer of adhesive layer material and conductor film material is formed in an overlapping area of the region confronting the first cathode and the region confronting the second cathode, said overlapping area being defined by the interval of the film form substrate and shield plate, and a conductor film is formed in the region confronting the second cathode.

In the above method, even if the film forming is conducted at the substrate temperature below the temperature for inducing diffusion at the interface of the conductor film and adhesive layer, for example, 100° C. or less, an alloy layer of adhesive layer and conductor film is present on the interface of the adhesive layer and conductor film so as to be closer to a bulk state, and attraction between molecules is enhanced, so that the bonding force of the conductor film and adhesive layer is improved. Accordingly, when the conductor film is thus formed on the substrate, if machined in a later process, peeling hardly occurs on the interface of the conductor film and adhesive layer, and deterioration and defect of products due to peeling of the film can be prevented.

EMBODIMENTS

Figure 1:
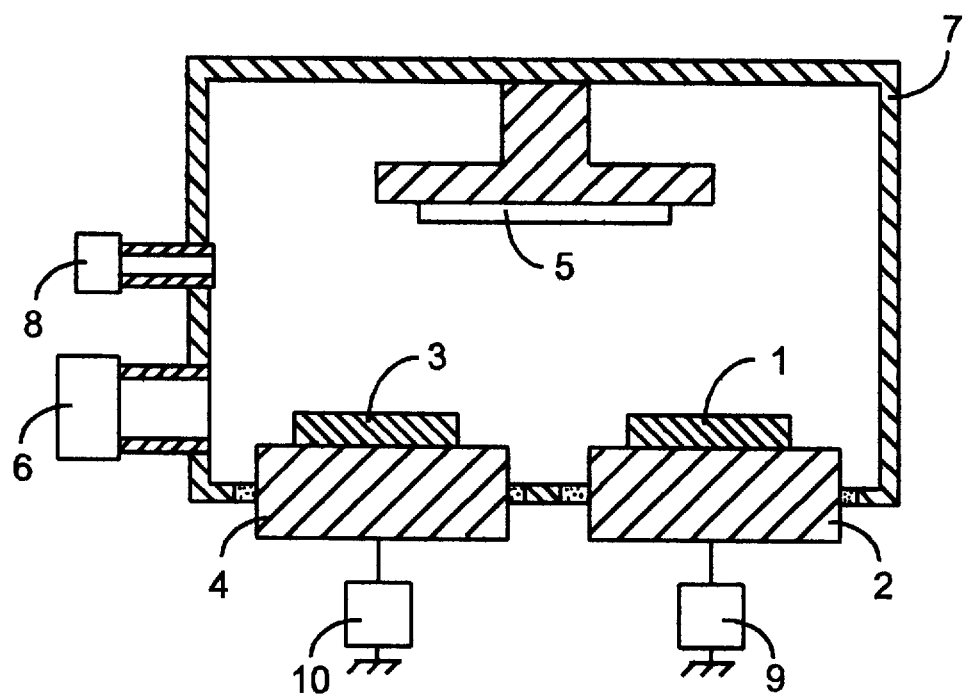
FIG. 1 is a longitudinal sectional view of a sputtering apparatus used in a forming method of conductor film of the invention.
Figure 2A:
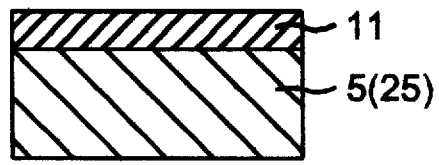
FIG. 2(a), 2(b), and 2(c) are sectional views showing the states of a film forming process of the conductor film.
Figure 2B:
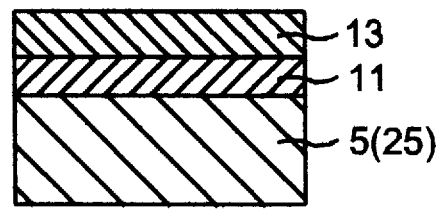
Figure 2C:
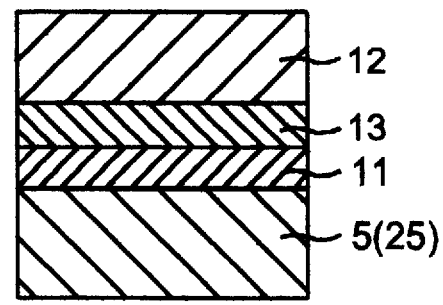

Referring now to FIG. 1 and FIGS. 2(a), to 2(c) an embodiment of the invention is described below.

In FIG. 1, reference numeral 1 is a material target of conductor film such as electrode film and wiring film, 2 is a cathode having the material target of the conductor film 1, 3 is a material target of an adhesive layer, 4 is a cathode having the material target of the adhesive layer 3, and 5 is a substrate of ceramics, glass on which a conductor film is to be formed by sputtering, said substrate being disposed oppositely to the cathode 2 and cathode 4. Herein, the material target 1 is Ag, and the material target 3 is Cr.

Reference numeral 6 is a vacuum exhaust pump for evacuating a vacuum container 7, and 8 is a gas feed system for feeding sputtering gas into the vacuum container 7. Reference numeral 9 is a direct-current power source for applying a voltage to the cathode 2 and generating plasma on the surface of the target 1. Reference numeral 10 is a direct current power source for applying a voltage to the cathode 4 and generating plasma on the surface of the target 3.

Using thus composed sputtering apparatus, the operation for forming a conductor film such as electrode film and wiring film on the substrate 5 is described below.

First, the inside of the vacuum container 7 is evacuated by the vacuum exhaust pump 6 to a degree of vacuum of the level of 10–6 Torr. Then argon gas is introduced into the vacuum container 7 from the gas feed system 8, and the degree of vacuum is set at about 5×10–3 Torr.

From the direct-current power source 10, 500 W is applied to the cathode 4, and plasma is generated inside the vacuum container 7, and thereby an adhesive layer 11 is formed on the substrate 5 in a thickness of 500 Å in 60 seconds as shown in FIG. 2(a).

Then, while applying 500 W to the cathode 4 by the direct-current power source 10, 1 kW is applied to the cathode 2 by the direct-current power source 9, and plasma is generated simultaneously in the cathode 4 and cathode 2 in the vacuum container 7, thereby forming a mixed layer 13 of adhesive layer material and conductor film material on the adhesive layer 11 formed on the substrate 5 in a thickness of 500 Å in 30 seconds as shown in FIG. 2(b).

Consequently, while stopping the electric power load to the cathode 4 by the direct-current power source 10, 1 kW is applied to the cathode 2 from the direct-current power source 9 to discharge, and plasma is generated in the vacuum container 7, so that a conductor film 12 is formed on the mixed layer 13 in a thickness of 2500 Å in 90 seconds as shown in FIG. 2(c).

According to this method, which does not require heating over 100° C. to induce diffusion on the interface of the adhesive layer 11 and conductor film 12, since the mixed layer 13 is formed in the interface as the alloy layer of the adhesive layer material and conductor film material, thereby nearing close to a bulk state, the attraction between molecules is increased, and the bonding force between the adhesive layer 11 and conductor film 12 is notably increased.

Tensile bond strength test by Sebastian tensile strength tester (Quad Group, U.S.A.) was conducted on the conductor film of the invention formed in this manner and a conventional conductor film formed in the same manner except that the mixed layer is not formed, by applying tensile load to the conductor films vertically to bonded surfaces of each layers. As a result, peeling was not observed in the conductor film of the invention until exceeding 800 kg/cm$^2$, whereas the conventional conductor film was peeled at about 400 kg/cm$^2$. Hence, it is known that the conductor film of the invention is substantially improved in the bonding strength in the interface with the adhesive layer as compared with the conventional composition.

Therefore, even in the substrate wherein polarization from the heating causes the piezo electric effect to vary at 100° C. or more, a conductor film hardly peeling on the interface with the adhesive layer may be formed.

By varying the power of the power source applied to the cathode 2 and cathode 4, the mixing ratio of the mixed layer 13 may be adjusted freely. Or by varying the time of simultaneous discharge of the cathode 2 and cathode 4, the film thickness of the mixed layer 13 can be controlled. Consequently, the strongest condition of bonding strength may be determined. Usually, both the adhesive layer 11 and mixed layer 13 are formed in a film thickness of over 1/10 of the conductor film 12.

Another embodiment of the invention is described below while referring to FIGS. 2(a) to 2(c) and FIG. 3.

Figure 3:
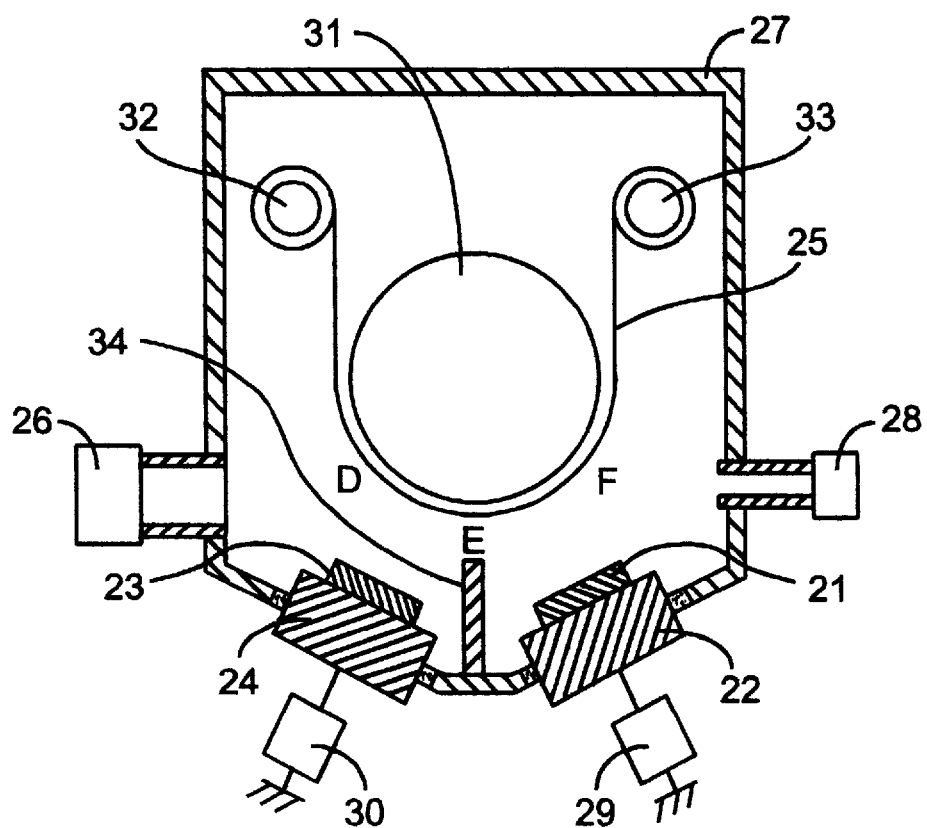
FIG. 3 is a longitudinal sectional view of a sputtering apparatus used in other forming method of conductor film of the invention.

In FIG. 3, reference numeral 21 is a material target of conductor film such as electrode film and wiring film, 22 is a cathode having the material target of conductor film 21, 23 is a material target of adhesive layer, 24 is a cathode having the material target of adhesive layer 23, and 25 is a film form substrate on which conductor film is to be formed by sputtering, said film form substrate being a film made of ceramics, glass or the like or a film bearing one of such substrate materials thereon. The film form substrate 25 is disposed oppositely to the cathode 22 and cathode 24. Herein, the material target 21 is Ag and the material target 23 is Cr.

Reference numeral 26 is a vacuum exhaust pump for evacuating a vacuum container 27, and 28 is a gas feed system for feeding sputtering gas into the vacuum container 27. Reference numeral 29 is a direct-current power source for applying a voltage to the cathode 22 for generating plasma on the surface of the target 21. Reference 30 is a direct-current power source for applying a voltage to the cathode 24 for generating plasma on the surface of the target 23.

Reference numeral 31 is a can roller having a coolant circulating inside thereof and disposed oppositely to the cathode 22 and the cathode 24 for cooling and rotating the film form substrate 25, 32 is a feed roller for feeding the film form substrate 25 to the can roller 31, and 33 is a take-up roller for taking up the film form substrate 25 having been formed. Reference numeral 34 is a shield plate disposed between the cathode 22 and cathode 24, and its gap with the film form substrate 25 which is made to run by rotation of the can roller 31 is set at about 5 mm.

Using the sputtering apparatus in FIG. 3, the operation for forming a conductor film on the film form substrate 5 is described below.

First, the inside of the vacuum container 27 is evacuated by the vacuum exhaust pump 26 to a degree of vacuum of the level of 10–6 Torr. Then argon gas is introduced into the vacuum container 27 from the gas feed system 28, and the degree of vacuum is set at about 5×10–3 Torr.

Then, rotating the feed roller 32, can roller 31, and take-up roller 33, the film form substrate 25 is caused to run along the outer circumference of the can roller 31 at a rate of about 160 mm/min. Subsequently, 500 W is applied to the cathode 24 by the direct-current power source 30 and 1 kW is applied to the cathode 22 by the direct-current power source 29, so that plasma is generated in the vacuum container 27.

As a result, in area D in FIG. 3, an adhesive layer 11 is formed on the surface of the film form substrate 25 as shown in FIG. 2(a). Next, in area E in FIG. 3, since there is a gap between the shield plate 34 and film form substrate 25, the adhesive layer material sputtered from the cathode 24 and the conductor film material sputtered from the cathode 22 are deposited simultaneously, and thereby, as shown in FIG. 2 (b), a mixed layer 13 of adhesive layer material and conductor film material is formed on the adhesive layer 11. Then, in area F in FIG. 3, a conductor film 12 is formed on the mixed layer 13 as shown in FIG. 2(c).

At this time, the film form substrate 25 is controlled under 100° C. by the can roller 31 in which the coolant is circulating, and the film form substrate 25 is not deformed thermally. The film form substrate 25 having been formed is finally taken up on the take-up roller 33.

In the shown method, though the temperature of the film form substrate 25 is 100° C. or less and the interface of the adhesive layer 11 and conductor film 12 is free from diffusion, the mixed layer 13 or the alloy layer of adhesive layer material and conductor film material is formed on the interface of the adhesive layer 11 and conductor film 12, nearing close to the bulk state. Accordingly, same as in the foregoing embodiment, the bonding strength of the adhesive layer and conductor film is notably enhanced.

Moreover, by varying the interval of the shield plate 34 and the film form substrate 25 running on the outer circumference of the can roller 31, the film thickness of the mixed layer 13 can be controlled, and the condition of the strongest bonding strength can be determined.

In these embodiments, the direct-current sputtering method is shown, but the conductor film may be similarly formed by high-frequency sputtering method or evaporation method. In the case of high-frequency sputtering method, for example, by applying high-frequency electric power to each cathodes in the same conditions as above, the conductor film, mixed layer and adhesive layer can be deposited on the confronting substrate surfaces. In the case of evaporation, for example, by evacuating to the degree of vacuum of the level of 10–7 Torr, argon gas is fed and the degree of vacuum is set around 10–7 Torr, and the adhesive layer material and conductor film material are heated and evaporated by resistance heater or electron beam heater, so as to be deposited on the confronting substrate surfaces. Yet, the degree of vacuum usually applied in the film forming technique and other conditions and techniques may be also employed.

As clear from the description herein, according to the forming method of a conductor film of the invention, if the film is formed below the temperature at which diffusion is induced on the interface of the conductor film and adhesive layer, an alloy layer mixing the adhesive layer material and conductor film material is present on the interface of the adhesive layer and conductor film, nearing close to the bulk state, whereby the attraction between molecules is enhanced, and the bonding strength and the contact between the conductor film and the adhesive layer are enhanced. Accordingly, in the later process for manufacturing products, peeling can be prevented on the interface of the conductor film and adhesive layer in machining process, and shortening of product life due to peeling of film can be prevented.

By polarization or in its piezo electrical effect, and the film-form less, the substrate used in electronic components is not changed in electrical characteristic, and the film form substrate is free from thermal deformation, whether the substrate material is made into a film or the substrate material is fixed on a film.

Still more, by placing the cathode having conductor film material and the cathode having adhesive layer material in a same vacuum container, and discharging the cathodes properly, the conductor film can be formed by a series of processes in a same sputtering apparatus.

Also, by placing the cathode having conductor film material and the cathode having adhesive layer material in a same vacuum container with a shield plate standing therebetween, and effecting sputtering while moving the film form substrate at a constant speed, with a gap kept between the shield plate and the film form substrate, the conductor film can be formed continuously on the film form substrate.

What is claimed is:

1. A conductor film formed on a substrate of ceramics, glass, comprising an adhesive layer on a substrate;

a mixed layer comprising an adhesive layer material and conductor film material on an interface of the adhesive layer and the conductor film layer; and a conductor film layer interfaced on the mixed layer and containing at least one element selected form the group consisting of Ag, Au, Cu and Al.

2. A conductor film according to claim 1, wherein the adhesive layer contains at least one of Cr and NiCr.

3. A method of forming a conductor film from at least one element selected from the group consisting of Ag, Au, Cu, Al, on a substrate of ceramics, glass, comprising the steps of:

forming an adhesive layer of Cr, NiCr, on a substrate by at least one of sputtering and evaporation;

forming a mixed layer of adhesive layer material and conductor film material on the adhesive layer by at least one of sputtering and evaporating the adhesive and conductor film simultaneously, and forming a conductor film on the mixed layer.

4. A forming method of conductor film according to claim 3, wherein the forming temperature is 100° C. or less.

5. A forming method of conductor film according to claim 3 or 4, wherein a cathode having conductor film material and a cathode having adhesive layer material are installed in a same vacuum container of a sputtering apparatus, and wherein in the sputtering process, initially only the cathode having adhesive layer material is discharged for time T1 to form an adhesive layer on the substrate, then the cathode having adhesive layer material and the cathode having conductor film material are simultaneously discharged for time T2 to form a mixed layer of adhesive layer material and conductor film material, and finally only the cathode having conductor film material is discharged for time T3 to form a conductor film.

6. A forming method of a conductor film according to claim 3, wherein a first cathode having adhesive layer material and a second cathode having conductor film material are installed in a same vacuum container of a sputtering apparatus with a shield plate standing therebetween, a film form substrate composed of a film such as a substrate forming film or a film bearing a substrate thereon is sputtered while moving the position confronting each cathode and shield plate in a direction from the first cathode to the second cathode at a constant speed to form an adhesive layer in a region confronting the first cathode, a mixed layer of adhesive layer material and conductor film material is formed in an overlapping area of the region confronting the first cathode and the region confronting the second cathode, said overlapping area being defined by the interval of the film form substrate and shield plate, and a conductor film is formed in the region confronting the second cathode.

* * * * *